(12) United States Patent
Lee

(10) Patent No.: US 12,399,539 B2
(45) Date of Patent: Aug. 26, 2025

(54) WATERPROOF ELECTRONIC DEVICE AND FAN DEVICE THEREOF

(71) Applicant: Getac Technology Corporation, New Taipei (TW)

(72) Inventor: Kun-Cheng Lee, Taipei (TW)

(73) Assignee: Getac Technology Corporation, New Taipei (TW)

( * ) Notice: Subject to any disclaimer, the term of this patent is extended or adjusted under 35 U.S.C. 154(b) by 304 days.

(21) Appl. No.: 18/164,601

(22) Filed: Feb. 5, 2023

(65) Prior Publication Data
US 2023/0400891 A1    Dec. 14, 2023

Related U.S. Application Data

(60) Provisional application No. 63/350,914, filed on Jun. 10, 2022.

(30) Foreign Application Priority Data

Nov. 17, 2022   (CN) .......................... 202211461703.5

(51) Int. Cl.
*H05K 7/20*      (2006.01)
*G06F 1/16*      (2006.01)
(Continued)

(52) U.S. Cl.
CPC ............ *G06F 1/1658* (2013.01); *G06F 1/203* (2013.01); *H01R 13/5208* (2013.01);
(Continued)

(58) Field of Classification Search
CPC ... G06F 1/1658; G06F 1/203; H01R 13/5208; H01R 33/965; H01R 33/74; H01R 33/97;
(Continued)

(56) References Cited

U.S. PATENT DOCUMENTS 7,054,155 B1    5/2006  Mease et al.
7,158,376 B2 *  1/2007  Richardson .......... G06F 1/1626
                                               361/679.56
(Continued)

FOREIGN PATENT DOCUMENTS

CN       104847680 B     1/2018
CN       104808743 B     1/2019
(Continued)

OTHER PUBLICATIONS

Office Action issued on Oct. 27, 2023 for AU application No. 2023200811.

*Primary Examiner* — Anatoly Vortman
(74) *Attorney, Agent, or Firm* — Cooper Legal Group, LLC

(57) ABSTRACT

A waterproof electronic device and a fan device thereof are provided. The waterproof electronic device includes a housing, a system component region, a waterproof wall, and the fan device. The system component region includes a first connecting device exposed to the housing. The waterproof wall is disposed between the housing and the system component region. A fan receiving area, a wire passing area, and an opening exposed to the housing are defined by the waterproof wall. The opening corresponds in position to the first connecting device. The fan device includes a fan lid, a fan body, a cable, and a second connecting device that is coupled to the first connecting device. The fan lid is fixed to the waterproof wall and covers the fan receiving area. The cable is connected to the fan body and the second connecting device, and passes through the wire passing area.

13 Claims, 8 Drawing Sheets

(51) Int. Cl.
*G06F 1/20* (2006.01)
*H01R 13/52* (2006.01)
*H01R 33/965* (2006.01)
*H01R 33/74* (2006.01)
*H01R 33/97* (2006.01)

(52) U.S. Cl.
CPC ....... *H01R 33/965* (2013.01); *H05K 7/20145* (2013.01); *H05K 7/20154* (2013.01); *H05K 7/20172* (2013.01); *H01R 33/74* (2013.01); *H01R 33/97* (2013.01); *H01R 2201/06* (2013.01)

(58) Field of Classification Search
CPC ........... H01R 2201/06; H05K 7/20145; H05K 7/20154; H05K 7/20172
USPC ...................................................... 361/679.49
See application file for complete search history.

(56) References Cited

U.S. PATENT DOCUMENTS

| | | | | |
|---|---|---|---|---|
| 7,336,489 | B1* | 2/2008 | Chen | G06F 1/203 |
| | | | | 165/104.34 |
| 8,111,513 | B2* | 2/2012 | Yeh | G06F 1/20 |
| | | | | 174/16.3 |
| 8,759,721 | B1* | 6/2014 | Alexander | A47J 36/321 |
| | | | | 165/61 |
| 9,383,788 | B2 | 7/2016 | Reber et al. | |
| 2004/0212960 | A1 | 10/2004 | Shih | |
| 2005/0030707 | A1* | 2/2005 | Richardson | G06F 1/1626 |
| | | | | 361/679.56 |
| 2009/0103265 | A1 | 4/2009 | Hongo | |
| 2010/0309623 | A1* | 12/2010 | Yeh | G06F 1/203 |
| | | | | 361/679.48 |
| 2013/0213617 | A1* | 8/2013 | Chou | F28F 13/12 |
| | | | | 165/121 |
| 2015/0253819 | A1* | 9/2015 | Choi | G06F 1/182 |
| | | | | 361/679.02 |
| 2021/0059065 | A1* | 2/2021 | Lee | H05K 5/023 |
| 2021/0089090 | A1* | 3/2021 | Lee | E05D 3/02 |
| 2021/0408659 | A1* | 12/2021 | Lee | G06F 1/1698 |
| 2022/0091638 | A1* | 3/2022 | Lee | H04M 1/0274 |
| 2022/0200169 | A1* | 6/2022 | Lee | H01Q 1/243 |

FOREIGN PATENT DOCUMENTS

| | | |
|---|---|---|
| CN | 114167945 A | 3/2022 |
| CN | 216217932 U | 4/2022 |
| DE | 102014002452 A1 | 9/2014 |
| JP | 2018206958 A | 12/2018 |
| TW | 453470 U | 9/2001 |
| TW | M504440 U | 7/2015 |
| TW | I614592 B | 2/2018 |
| WO | WO2004100262 A1 | 11/2004 |

* cited by examiner

WATERPROOF ELECTRONIC DEVICE AND FAN DEVICE THEREOF

CROSS-REFERENCE TO RELATED PATENT APPLICATION

This application claims the benefit of priority to the U.S. Provisional Patent Application Ser. No. 63/350,914 filed on Jun. 10, 2022, and to China Patent Application No. 202211461703.5 filed on Nov. 17, 2022 in People's Republic of China, both of which applications are incorporated herein by reference in their entirety.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a waterproof electronic device and a fan device thereof, and more particularly to an electronic device having waterproof and dustproof functions, and a fan device installed in the electronic device.

BACKGROUND OF THE DISCLOSURE

An industrial computer (or referred to as a rugged laptop) is usually used outdoors. Since an environment in which the industrial computer is used is generally poor, the industrial computer is required to have high-temperature resistant, low-temperature resistant, heat-dissipating, dustproof, and waterproof properties. In order for the industrial computer to have a high heat-dissipating effect, like traditional desktop computers or laptops, a heat-dissipating fan and heat-dissipating holes are preferably provided on components that radiate a large amount of heat (e.g., a central processing unit, a hard disk, or a memory). However, due to the poor environment, such a heat-dissipating approach may not achieve the goals of being dustproof and waterproof. On the other hand, a dustproof and waterproof structure may cause inconveniences in dismount and maintenance of the heat-dissipating fan.

Therefore, how to enhance maintenance conveniences and waterproof and dustproof effects of a waterproof electronic device and a fan device thereof through an improvement in structural design, so as to overcome the above-mentioned deficiencies, has become one of the important issues to be solved in this industry.

SUMMARY OF THE DISCLOSURE

In response to the above-referenced technical inadequacies, the present disclosure provides a waterproof electronic device and a fan device thereof.

In order to solve the above-mentioned problems, one of the technical aspects adopted by the present disclosure is to provide a waterproof electronic device, which includes a housing, a system component region, a waterproof wall, and a fan device. The system component region includes a first connecting device exposed to the housing. The waterproof wall is disposed between the housing and the system component region. A fan receiving area, a wire passing area and an opening exposed to the housing are defined by the waterproof wall. The wire passing area is arranged between the fan receiving area and the opening, and the opening is corresponded in position to the first connecting device. The fan device includes a fan lid, a fan body, a cable and a second connecting device. The fan lid is fixed to the waterproof wall, covers the fan receiving area, and extends to the opening. The fan body is disposed in the fan receiving area. The cable is connected to the fan body and the second connecting device, and passes through the wire passing area, and the second connecting device is coupled to the first connecting device.

In order to solve the above-mentioned problems, another one of the technical aspects adopted by the present disclosure is to provide a fan device. The fan device includes a fan lid, a fan body, a cable, and a fan-end connecting device. The fan body is fixed to one end of the fan lid. The fan-end connecting device is disposed at another end of the fan lid. The cable is connected to the fan body and the fan-end connecting device.

Therefore, in the waterproof electronic device and the fan device thereof provided by the present disclosure, the fan device provides the fan-end connecting device (or referred to as the second connecting device) that is pluggable. The second connecting device is connected to the first connecting device in a pluggable manner, so that the fan device can be disposed in a replaceable manner in the waterproof electronic device.

In addition, by virtue of "a waterproof wall being disposed between the housing and the system component region," "a fan receiving area, a wire passing area, and an opening exposed to the housing being defined by the waterproof wall," and "wherein the cable is connected to the fan body and the second connecting device and passing through the wire passing area, and the second connecting device is coupled to the first connecting device," a waterproof performance of the waterproof electronic device can be enhanced.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
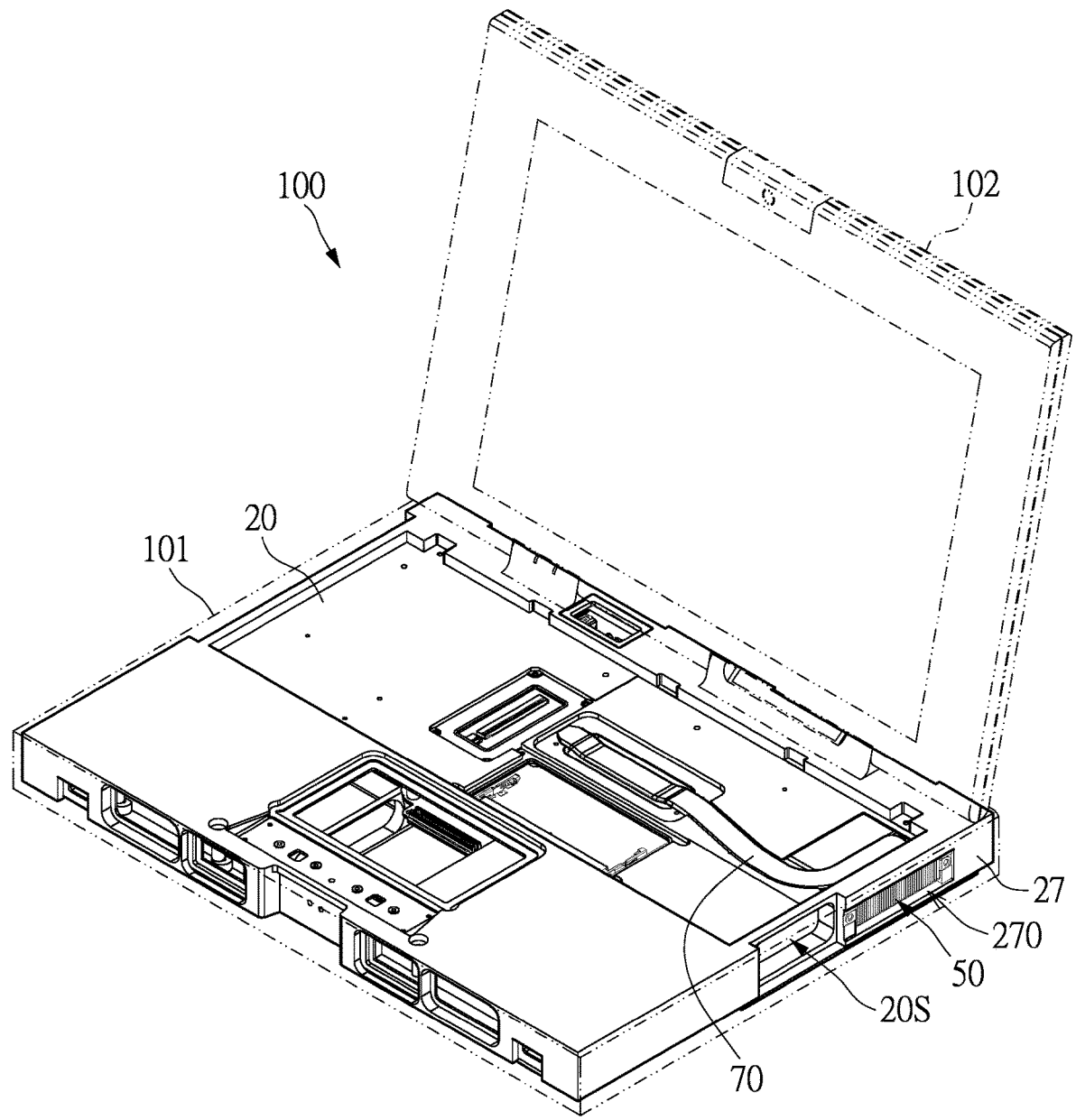
FIG. 1 is a schematic perspective view of a waterproof electronic device according to the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 2:
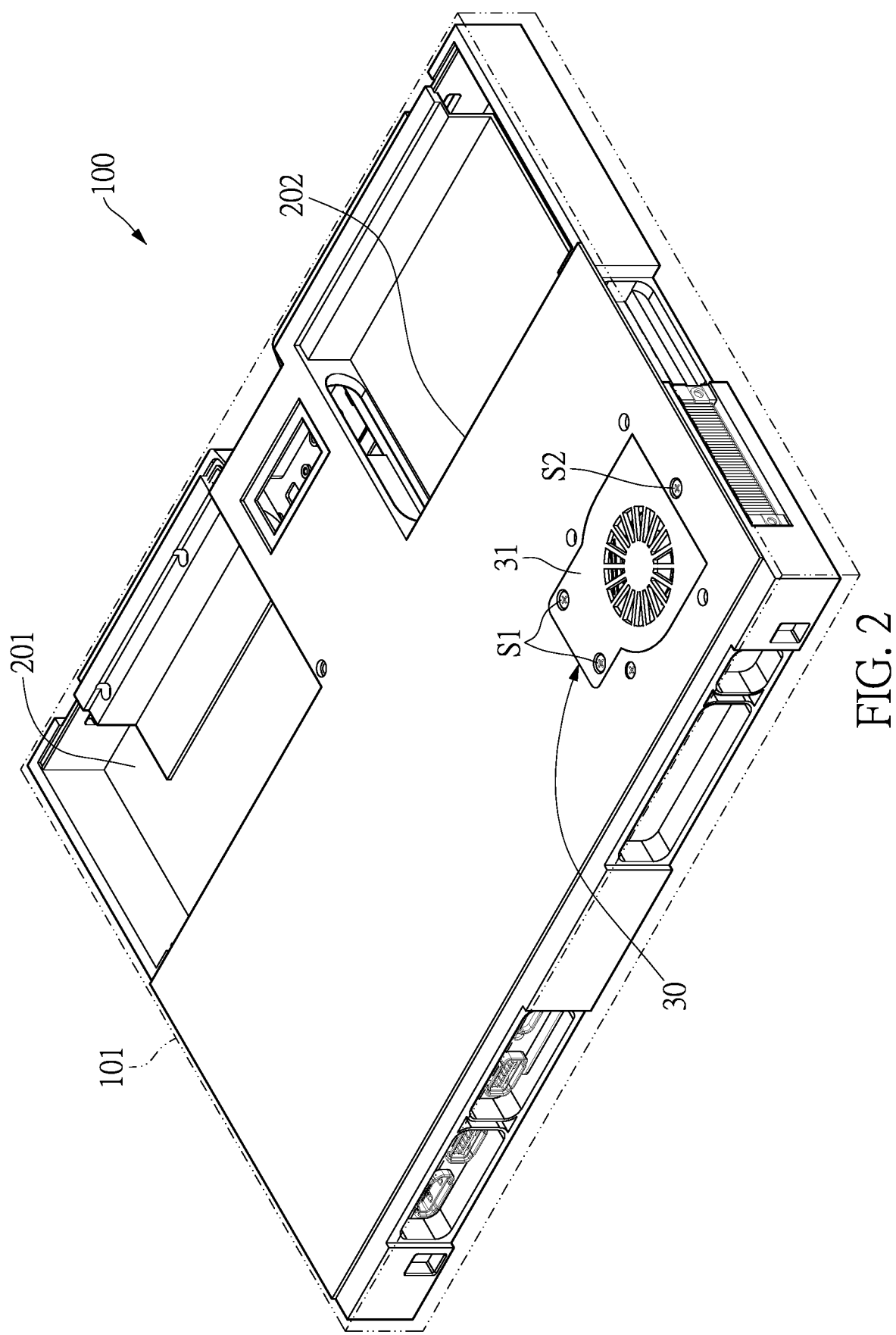
FIG. 2 is a schematic bottom perspective view of the waterproof electronic device according to the present disclosure.

Referring to FIG. 1 to FIG. 2, the present disclosure provides a waterproof electronic device 100. For example, said electronic device can be applied to a waterproof laptop computer, and more particularly to an industrial laptop computer. As shown in FIG. 1, the waterproof electronic device 100 includes a device main body 101 and a display screen 102. For convenience of illustration, a keyboard and an outer casing are not shown in FIG. 1. The display screen 102 is rotatably connected to one side of the device main body 101. However, the present disclosure is not limited thereto. For example, said electronic device can also be applied to a tablet computer or other electronic devices having a waterproof function (which are not necessarily equipped with a monitor).

In this embodiment, an electronic component that has a good waterproof performance is disposed in the waterproof electronic device 100, and can prevent liquid or dust from entering into the device main body 101. More importantly, the electronic component is replaceable. Specifically, the electronic component is exemplified as a fan device at a back side of a laptop computer.

Figure 3:
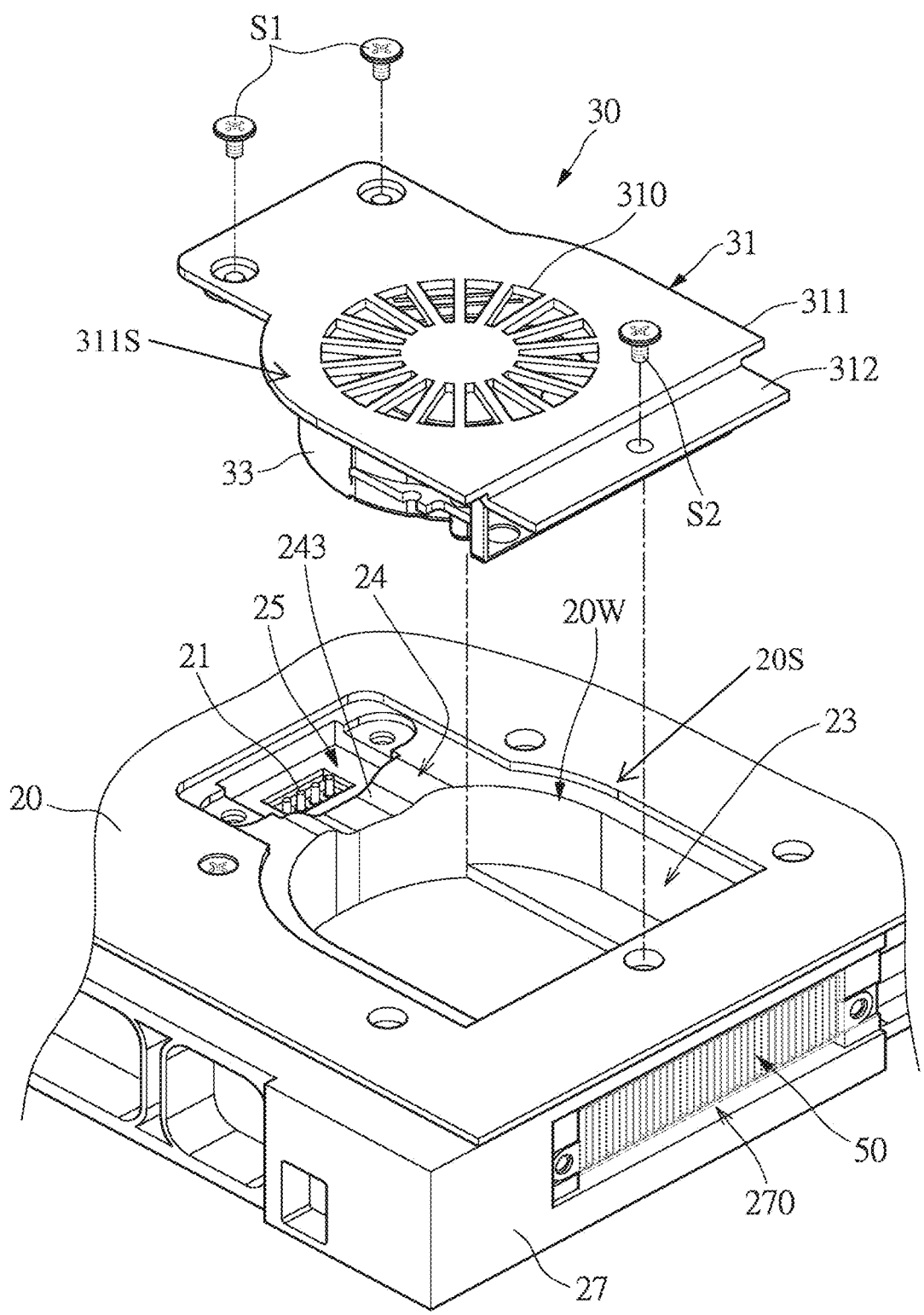
FIG. 3 is a partial schematic exploded view of the waterproof electronic device and a fan device according to the present disclosure.
Figure 4:
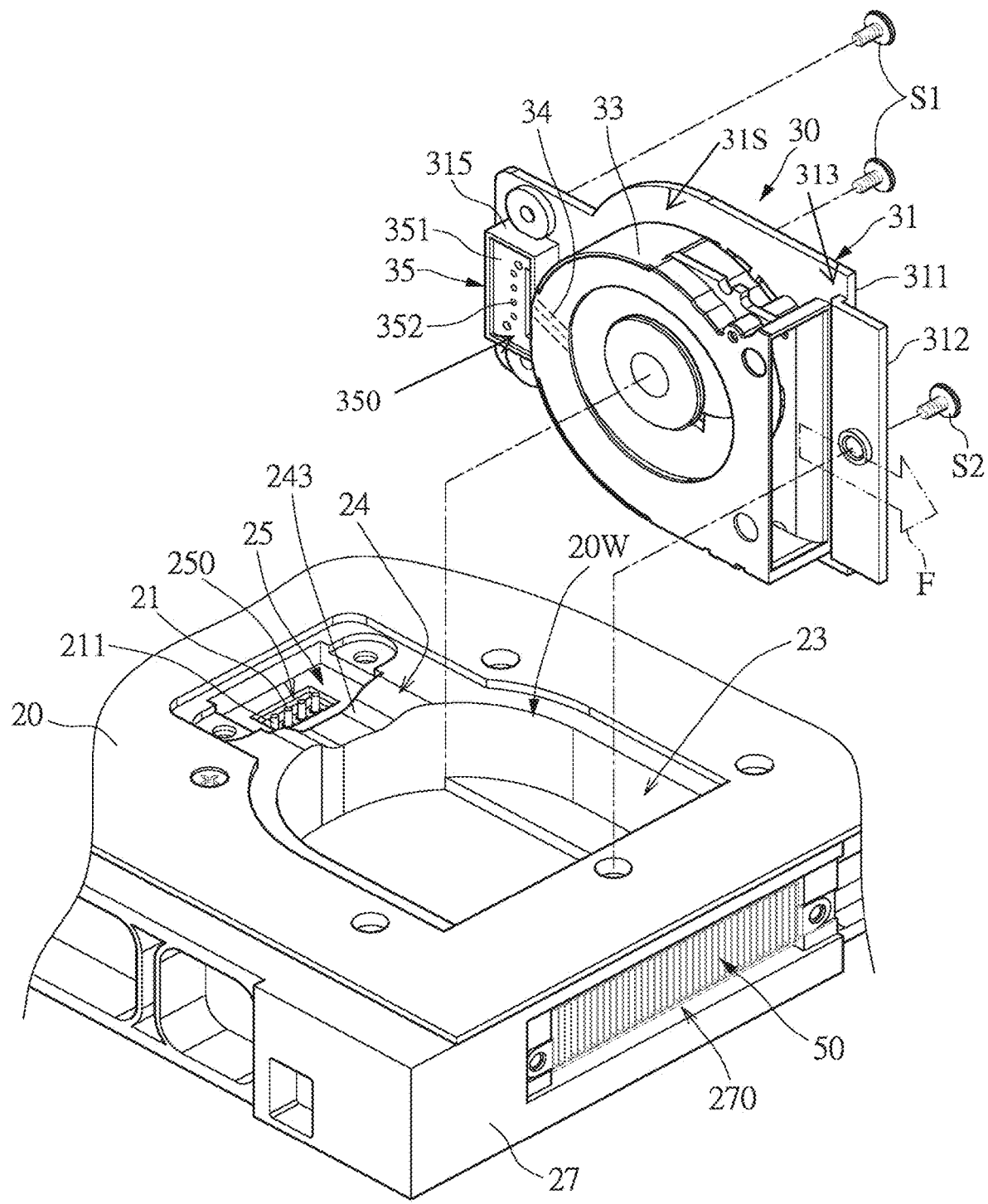
FIG. 4 is another partial schematic exploded view of the waterproof electronic device and the fan device according to the present disclosure.

Reference is made to FIG. 2 to FIG. 4. The waterproof electronic device 100 includes a housing 20, a system component region 20S, a waterproof wall 20W, and a fan device 30. The housing 20 is hollow, and the material of the housing 20 can be metal. A keyboard (not shown) and a touch pad (not shown) can be disposed on a top surface of the housing 20. As shown in FIG. 2, at least one receiving area (201, 202) is formed on a lower surface of the housing 20 for accommodating, for example, a battery. The system component region 20S is formed inside the housing 20 for receiving electronic elements (e.g., a main circuit board, not shown). The waterproof wall 20W is concaved from a back surface of the housing 20, and is integrally formed with the housing 20. The waterproof wall 20W corresponds in shape to the fan device 30. In this embodiment, the waterproof wall 20W does not occupy a peripheral space of the device main body 101 of the laptop computer, such that other input/output ports can be flexibly arranged in the peripheral space.

The system component region 20S includes a first connecting device 21 exposed to the housing 20. The first connecting device 21 can be referred to as a system-end connecting device. The first connecting device 21 has one end that is internally connected to the main circuit board (not shown), and has another end that is externally and electrically connected to the fan device 30.

The waterproof wall 20W is disposed between the housing 20 and the system component region 20S, and is concaved in the housing 20 in an integral manner. The waterproof wall 20W is formed with a fan receiving area 23, a wire passing area 24, and an opening 250 exposed to the housing 20. The wire passing area 24 is located between the fan receiving area 23 and the opening 250. The opening 250 is corresponded in position to the first connecting device 21. The fan receiving area 23 is used to receive the fan device 30.

Figure 5:
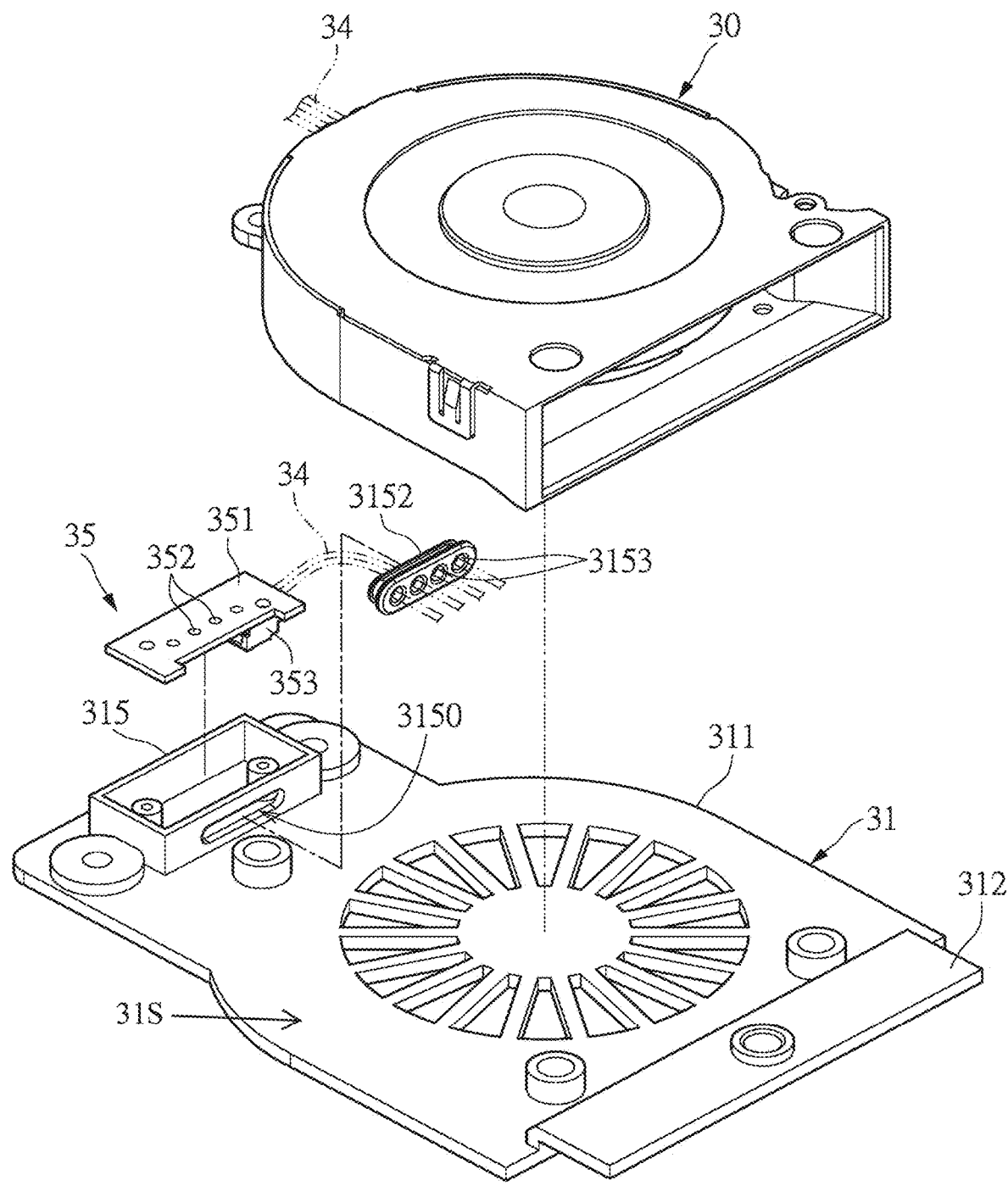
FIG. 5 is a schematic exploded view of the fan device according to the present disclosure.
Figure 6:
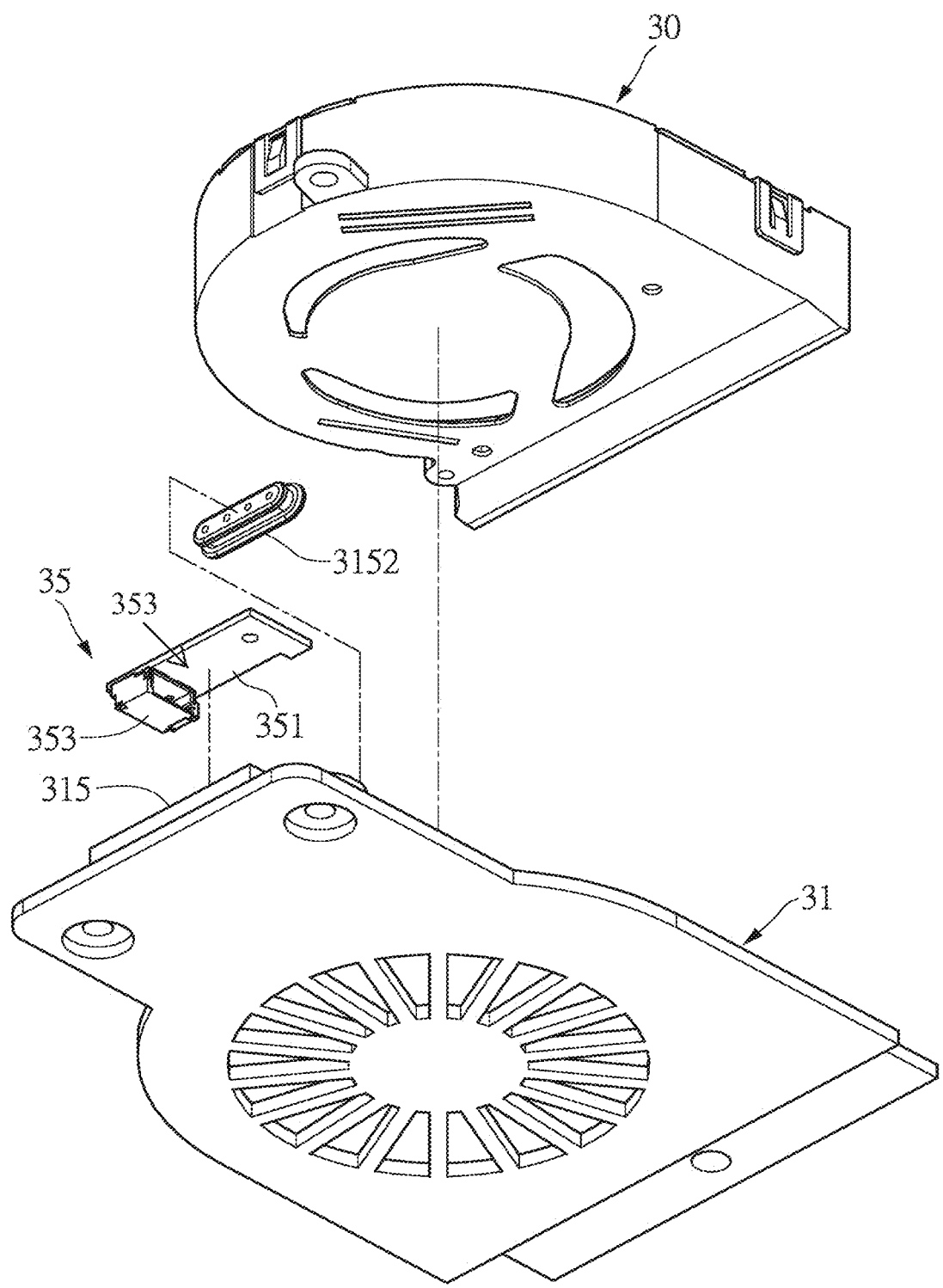
FIG. 6 is another schematic exploded view of the fan device according to the present disclosure.

Referring to FIG. 4 to FIG. 6, the fan device 30 includes a fan lid 31, a fan body 33, a cable 34, and a second connecting device 35. The fan lid 31 is fixed to the waterproof wall 20W, covers the fan receiving area 23, and extends to the opening 250. Specifically, the fan lid 31 is fastened to the waterproof wall 20W (as shown in FIG. 2) by fixing members S1, S2. The fixing member can be, for example, screws. In this embodiment, an airflow enters into the fan body 33 from the fan lid 31. The fan body 33 is fixed at one end of the fan lid 31. The cable 34 is connected to the fan body 33 and the second connecting device 35, and passes through the wire passing area 24. The second connecting device 35 can be referred to as a fan-end connecting device. The second connecting device 35 is disposed on another end of the fan lid 31. Specifically, the second connecting device 35 is located on a bottom surface 31S of the fan lid 31 and at one side of the fan body 33. Preferably, the second connecting device 35 of the fan device 30 can be coupled to the first connecting device 21 in a sealed manner.

As shown in FIG. 4, in this embodiment, the waterproof wall 20W is further formed with a connector receiving area 25. The connector receiving area 25 has a cube shape and is slightly concaved, and corresponds in shape and position to the second connecting device 35 of the fan device 30. The opening 250 is formed on a bottom of the connector receiving area 25, so that the first connecting device 21 is exposed. The wire passing area 24 protrudes slightly between the fan receiving area 23 and the connector receiving area 25. The wire passing area 24 is formed with a surface 243. The surface 243 is lower than an outer surface 20S of the waterproof wall 20W, and can receive the cable 34 of the fan device 30. The surface 243 can be a curved surface or a polygon surface. In other words, in this embodiment, the cable 34 is disposed above the surface 243 of the wire passing area 24 and is connected to the fan device 30. The cable 34 does not penetrate through the waterproof wall 20W.

The housing 20 has a side wall 27. The side wall 27 is formed with a fan vent 270. An air-outlet direction F of the fan device 30 is toward the fan vent 270. The waterproof electronic device 100 further includes a heat-dissipating fin assembly 50. The heat-dissipating fin assembly 50 is disposed between the fan body 33 and the fan vent 270. The heat-dissipating fin assembly 50 is disposed under the waterproof wall 20W.

As shown in FIG. 1, a heat pipe 70 of the waterproof electronic device 100 is disposed on a top surface of the housing 20, and is opposite to the fan device 30. One end of the heat pipe 70 contacts a heat-generating element (which is usually a central processing unit, not shown). Another end of the heat pipe 70, which is a heat-dissipating end, extends to contact the heat-dissipating fin assembly 50 for outward dissipation of the redundant heat. The heat pipe 70 is separated from the fan device 30, such that the waterproof performance can be improved without affecting dismount and assembly of the fan device 30.

Figure 7:
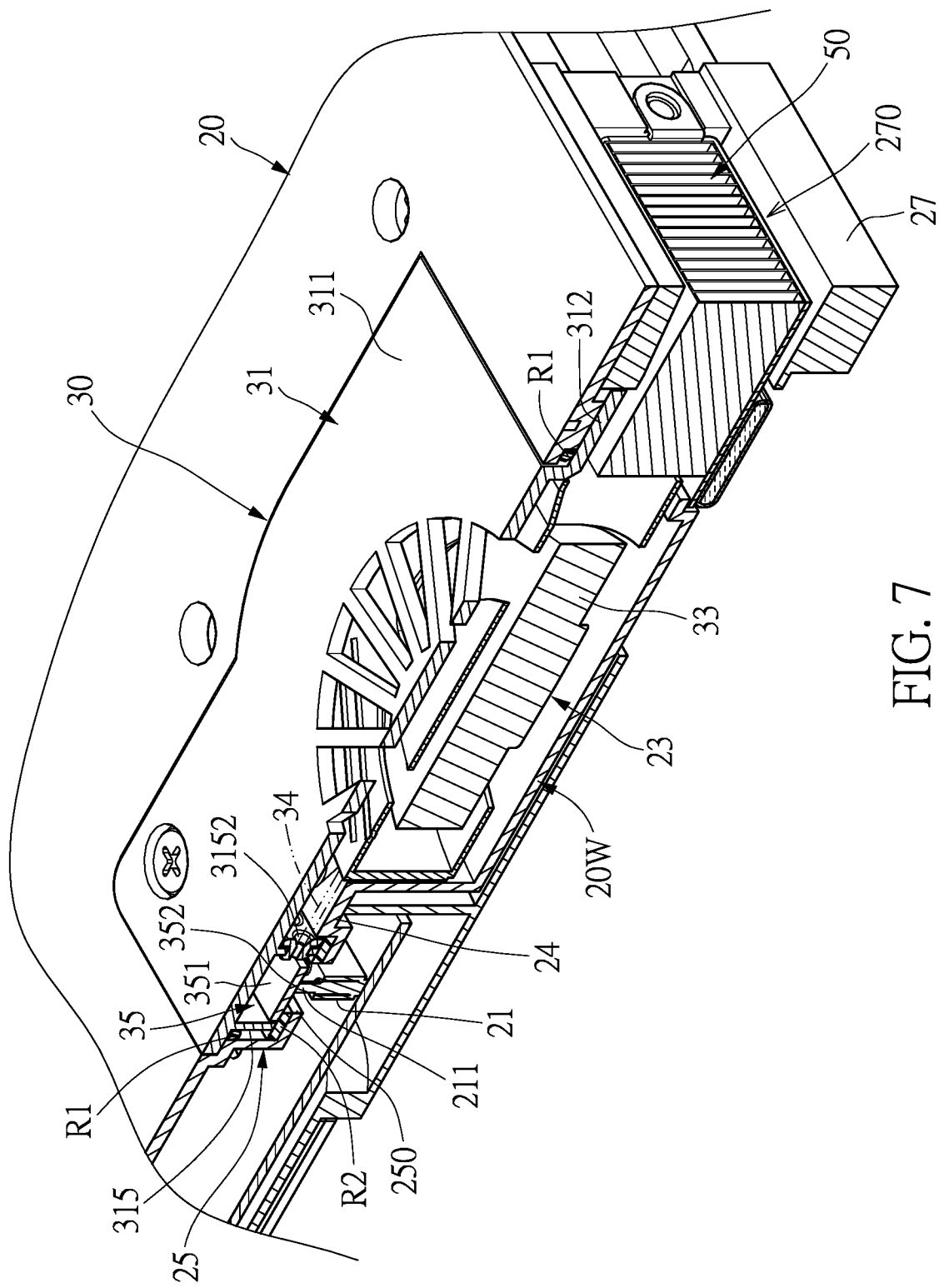
FIG. 7 is a partial cross-sectional perspective view of the waterproof electronic device according to the present disclosure.
Figure 8:
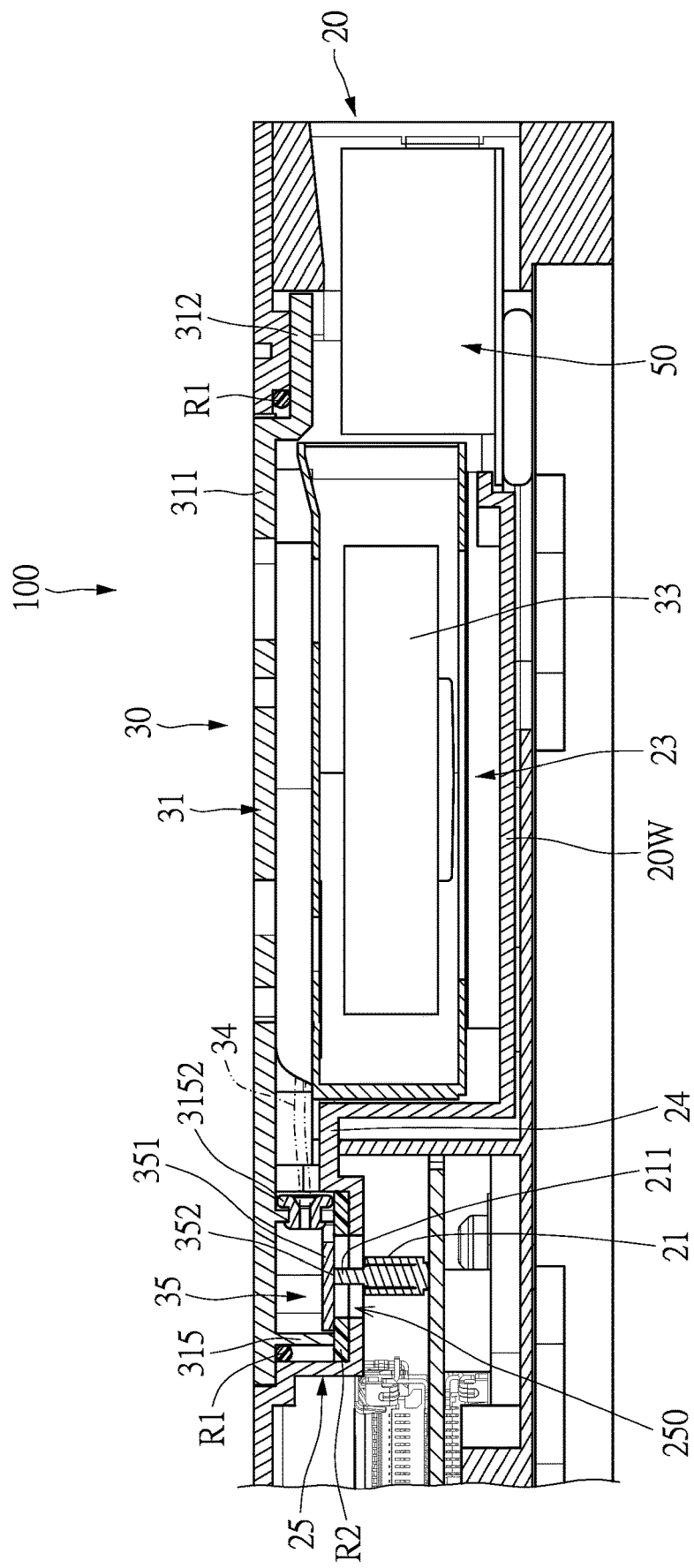
FIG. 8 is a partial cross-sectional view of the waterproof electronic device according to the present disclosure.

Referring to FIG. 4 and FIG. 5, the fan lid 31 includes a main cover 311, and an embedded board 312. In this embodiment, the embedded board 312 is slightly lower than the main cover 311 and parallel to the main cover 311. The main cover 311 is formed with an air intake 310, and the air intake 310 corresponds in position to the fan body 33. The embedded board 312 is extended outward from a bottom of one side 313 of the main cover 311. An outer surface 311S of the main cover 311 is flush with the outer surface 20S of the waterproof wall 20W. The embedded board 312 is lower than the main cover 311, and is inserted between the waterproof wall 20W and the heat-dissipating fin assembly 50 (as shown in FIG. 7 and FIG. 8). The embedded board 312 can be fastened to the housing 20 by the screw S2 (as shown in FIG. 3 and FIG. 4).

Referring to FIG. 5, in this embodiment, the fan lid 31 further includes a protective shell 315. The protective shell 315 is formed on the bottom surface 31S of the fan lid 31 and located at one side of the fan body 33. As shown in FIG. 5, the protective shell 315 has a rectangular shape formed by four walls and is not completely closed, and an opening thereof is away from the fan lid 31. The second connecting device 35 is received in the protective shell 315. The protective shell 315 is oriented toward the first connecting device 21 (as shown in FIG. 4). Appearance-wise, the protective shell 315 of the fan lid 31 corresponds to the connector receiving area 25 of the waterproof wall 20W.

One side of the protective shell 315 has a gasket hole 3150 and a cable waterproof ring 3152. The cable waterproof ring 3152 is disposed around the gasket hole 3150. The cable 34 of the fan device 30 passes through a cable hole 3153 of the cable waterproof ring 3152. The function of the cable waterproof ring 3152 is that, even if liquid or dust accidentally enters the fan lid 31, the cable waterproof ring 3152 can block the liquid or the dust from entering the protective shell 315 (i.e., from entering the second connecting device 35 of the fan device 30).

Referring to FIG. 4, FIG. 7 and FIG. 8, in this embodiment, the first connecting device 21 has a plurality of elastic contacts 211. The elastic contacts 211 can be, for example, pogo pins. However, the present disclosure is not limited thereto. The elastic contacts 211 are oriented toward the second connecting device 35. Correspondingly, the second connecting device 35 includes a circuit board 351, and the circuit board 351 is fastened in the protective shell 315 by a screw (not shown). One surface 350 of the circuit board 351 has a plurality of contact pads 352 formed thereon. The elastic contacts 211 correspondingly contact the contact pads 352.

Referring to FIG. 5 and FIG. 6, the second connecting device 35 further includes a cable connector 353. The cable connector 353 is disposed on another surface 353 of the circuit board 351, which is opposite to the contact pads 352. The cable connector 353 and the contact pads 352 are disposed on two opposite sides of the circuit board 351. The cable 34 is connected to the cable connector 353, and is externally connected to the fan device 30. An electrical connection sequence is arranged in the following order. The contact pads 352 are connected to the cable connector 353 through the circuit board 351. Then, the cable connector 353 is connected to the fan body 33 of the fan device 30 by the cable 34. The cable 34 passes through the cable waterproof ring 3152, and penetrates through the gasket hole 3150 of the protective shell 315.

Referring to FIG. 7 and FIG. 8, the fan device 30 can further include a first waterproof ring R1. The first waterproof ring R1 is disposed on a periphery of the fan body 33. Specifically, the first waterproof ring R1 can be configured to surround a periphery of the protective shell 315, a periphery of an inner surface of the main cover 311, and a corner between the main cover 311 and the embedded board 312. The first waterproof ring R1 can be strip-shaped and closed for serving as a first waterproof line, so as to enhance the waterproof performance of this embodiment.

In addition, the fan device 30 further includes a second waterproof ring R2. The second waterproof ring R2 is disposed between the first connecting device 21 and the second connecting device 35. Specifically, the second waterproof ring R2 is disposed on a bottom surface of the connector receiving area 25, and surrounds the opening 250. An edge of the protective shell 315 is in contact with the second waterproof ring R2. The second waterproof ring R2 can be formed to have a flat and rectangular shape, so that the second connecting device 35 can be coupled to the first connecting device 21 in a sealed manner.

As shown in FIG. 7 and FIG. 8, there are three protective lines between the second connecting device 35 and the first connecting device 21, which are the first waterproof ring R1, the second waterproof ring R2, and the cable waterproof ring 3152. In particular, the second waterproof ring R2 is disposed between the edge of the protective shell 315 and the bottom surface of the connector receiving area 25, and can provide a good waterproof function. In addition to a good waterproof function between the second connecting device 35 and the first connecting device 21 of the present disclosure, the fan device 30 can be replaceable in this embodiment due to the second connecting device 35 being detachably connected to the first connecting device 21. If the fan device 30 malfunctions, a user can easily dismount the fan device 30 from the waterproof wall 20W of the waterproof electronic device 100 by removing screws (S1, S2, as shown in FIG. 2) on the fan lid 31. Maintenance of the fan device 30 of this embodiment is convenient.

Beneficial Effects of the Embodiment

In conclusion, at least one of the effects in the waterproof electronic device and the fan device thereof provided by the present disclosure, the fan device 30 provides the fan-end connecting device (or referred to as the second connecting device 35) that is pluggable. The second connecting device 35 is connected to the first connecting device 21 in a pluggable manner, so that the fan device 30 can be disposed in a replaceable manner in the waterproof electronic device 100.

In addition, by virtue of "a waterproof wall being disposed between the housing and the system component region," "a fan receiving area, a wire passing area, and an opening exposed to the housing being defined by the waterproof wall," and "the cable being connected to the fan body and the second connecting device and passing through the wire passing area, and the second connecting device being coupled to the first connecting device," the waterproof performance of the waterproof electronic device can be enhanced.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A waterproof electronic device, comprising:
   a housing;
   a system component region, comprising a first connecting device exposed to the housing;
   a waterproof wall, wherein a fan receiving area, a wire passing area, and an opening exposed to the housing are defined by the waterproof wall, the wire passing area is arranged between the fan receiving area and the opening the opening corresponds in position to the first connecting device, and the first connecting device comprises a plurality of contacts exposed through the opening; and
   a fan device, comprising a fan lid, a fan body, a cable, and a second connecting device, wherein the fan lid is fixed to the waterproof wall, covers the fan receiving area, and extends to the opening, the fan body is disposed in the fan receiving area, the cable is connected to the fan body and the second connecting device and passes through the wire passing area, and the second connecting device is coupled to the first connecting device.

2. The waterproof electronic device according to claim 1, wherein the fan body is fixed to the fan lid.

3. The waterproof electronic device according to claim 1, wherein a connector receiving area is further defined by the waterproof wall, the opening is formed at a bottom of the connector receiving area, the wire passing area protrudes between the fan receiving area and the connector receiving area, the wire passing area is formed to have a concave surface, and the concave surface is lower than an outer surface of the waterproof wall.

4. The waterproof electronic device according to claim 1, wherein the housing has a side wall, a fan vent is formed on the side wall, and an air-outlet direction of the fan device is toward the fan vent.

5. The waterproof electronic device according to claim 4, further comprising a heat-dissipating fin assembly, wherein the heat-dissipating fin assembly is disposed between the fan body and the fan vent, and the heat-dissipating fin assembly is disposed under the waterproof wall.

6. The waterproof electronic device according to claim 5, wherein the fan lid comprises a main cover and an embedded board, an air intake is formed on the main cover, the air intake corresponds in position to the fan body, the embedded board extends outward from a bottom of one side of the main cover, an outer surface of the main cover is flush with an outer surface of the waterproof wall, the embedded board is lower than the main cover, and the embedded board is inserted between the waterproof wall and the heat-dissipating fin assembly.

7. The waterproof electronic device according to claim 1, wherein the fan lid further includes a protective shell, the protective shell is formed on a bottom surface of the fan lid, the second connecting device is received in the protective shell, the protective shell is oriented toward the first connecting device, the protective shell has a gasket hole and a cable waterproof ring, the cable waterproof ring is disposed on the gasket hole, and the cable passes through the cable waterproof ring.

8. The waterproof electronic device according to claim 1, wherein the plurality of contacts are a plurality of elastic contacts, the plurality of elastic contacts are oriented toward the second connecting device, the second connecting device comprises a circuit board, a plurality of contact pads are disposed on one surface of the circuit board, and the plurality of elastic contacts correspondingly contact the plurality of contact pads.

9. The waterproof electronic device according to claim 8, wherein the second connecting device further comprises a cable connector, the cable connector is disposed on another surface of the circuit board, and the cable is connected to the cable connector.

10. The waterproof electronic device according to claim 1, wherein the fan device further comprises a first waterproof ring, and the first waterproof ring is configured to surround a periphery of the fan body.

11. The waterproof electronic device according to claim 10, wherein the fan device further comprises a second waterproof ring, and the second waterproof ring is disposed between the first connecting device and the second connecting device.

12. The waterproof electronic device according to claim 1, wherein the wire passing area is between the fan receiving area and the opening.

13. The waterproof electronic device according to claim 1, wherein the second connecting device comprises a plurality of contact pads correspondingly contacting the plurality of contacts.

* * * * *